(12) United States Patent
Stevens et al.

(10) Patent No.: US 7,875,916 B2
(45) Date of Patent: Jan. 25, 2011

(54) PHOTODETECTOR AND N-LAYER STRUCTURE FOR IMPROVED COLLECTION EFFICIENCY

(75) Inventors: Eric G. Stevens, Webster, NY (US); David N. Nichols, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 851 days.

(21) Appl. No.: 11/453,354

(22) Filed: Jun. 15, 2006

(65) Prior Publication Data

US 2007/0069315 A1    Mar. 29, 2007

Related U.S. Application Data

(60) Provisional application No. 60/721,168, filed on Sep. 28, 2005.

(51) Int. Cl.
*H01L 31/062* (2006.01)
(52) U.S. Cl. .................. 257/292; 257/293; 257/233; 257/E31.058
(58) Field of Classification Search .......... 257/233, 257/292, 293, E31.058
See application file for complete search history.

(56) References Cited

U.S. PATENT DOCUMENTS

| | | | |
|---|---|---|---|
| 4,142,195 A | 2/1979 | Carlson et al. | |
| 4,527,182 A | 7/1985 | Ishihara et al. | |
| 4,672,455 A | 6/1987 | Miyatake | |
| 4,851,890 A | 7/1989 | Miyatake | |
| 5,238,864 A | 8/1993 | Maegawa et al. | |
| 5,608,204 A | 3/1997 | Höfflinger et al. | |
| 5,880,495 A | 3/1999 | Chen | |
| 5,898,196 A | 4/1999 | Hook et al. | |
| 6,023,081 A | 2/2000 | Drowley et al. | |
| 6,023,293 A | 2/2000 | Watanabe et al. | |
| 6,084,259 A * | 7/2000 | Kwon et al. | 257/292 |
| 6,107,655 A | 8/2000 | Guidash | |
| 6,150,682 A | 11/2000 | Sawada et al. | |

(Continued)

FOREIGN PATENT DOCUMENTS

DE    19933162    11/2004

(Continued)

OTHER PUBLICATIONS

S. Inoue et al., "A 3.25 M-pixel APS-C size CMOS Image Sensor," in Eisoseiho Media Gakkai Gijutsu Hokoku (Technology Report, Image Information Media Association) Eiseigakugiko, vol. 25, No. 28, pp. 37-41, Mar. 2001. ISSN 1342-6893. (Translation provided).

(Continued)

*Primary Examiner*—Tan N Tran
(74) *Attorney, Agent, or Firm*—Peyton C. Watkins; Nancy R. Simon (57) ABSTRACT

An image sensor with an image area having a plurality of photodetectors of a first conductivity type includes a substrate of the second conductivity type; a first layer of the first conductivity type spanning the image area; a second layer of the second conductivity type; wherein the first layer is between the substrate and the second layer, and the plurality of photodetectors is disposed in the second layer and abut the first layer.

12 Claims, 10 Drawing Sheets

U.S. PATENT DOCUMENTS

| | | | |
|---|---|---|---|
| 6,225,670 | B1 | 5/2001 | Dierickx |
| 6,297,070 | B1 | 10/2001 | Lee et al. |
| 6,423,993 | B1 | 7/2002 | Suzuki et al. |
| 6,504,196 | B1 | 1/2003 | Rhodes |
| 6,512,547 | B1 | 1/2003 | Miida |
| 6,593,607 | B1 | 7/2003 | Hseih |
| 7,064,362 | B2 | 6/2006 | Roy |
| 7,253,461 | B2 | 8/2007 | Yang et al. |
| 2001/0006237 | A1 | 7/2001 | Abe |
| 2002/0125513 | A1 | 9/2002 | Inoue |
| 2003/0096443 | A1* | 5/2003 | Hwang ................ 438/59 |
| 2003/0138990 | A1 | 7/2003 | Rhodes |
| 2004/0094784 | A1 | 5/2004 | Rhodes et al. |
| 2004/0140491 | A1 | 7/2004 | Rhodes et al. |
| 2004/0206991 | A1 | 10/2004 | Yato |
| 2004/0222449 | A1 | 11/2004 | Koyama |
| 2005/0087672 | A1 | 4/2005 | Kuwazawa et al. |
| 2006/0145202 | A1 | 7/2006 | Sawase et al. |
| 2006/0226438 | A1 | 10/2006 | Katsuno et al. |
| 2006/0244020 | A1 | 11/2006 | Lee |
| 2007/0069260 | A1 | 3/2007 | Stevens |
| 2007/0069315 | A1 | 3/2007 | Stevens et al. |
| 2007/0108371 | A1 | 5/2007 | Stevens et al. |

FOREIGN PATENT DOCUMENTS

| | | |
|---|---|---|
| EP | 0 809 299 | 11/1997 |
| EP | 0917206 | 5/1999 |
| EP | 1 128 437 | 8/2001 |
| EP | 1128437 | 1/2008 |
| EP | 0809299 | 4/2008 |
| GB | 2332049 | 6/1999 |
| WO | 00/00994 | 1/2000 |

OTHER PUBLICATIONS

Furumiya et al., "High Sensitivity and No-Cross-Talk Pixel Technology for Embedded CMOS Image Sensor", International Electron Devices Meeting 2000. IEDM Technical Digest, San Francisco, CA, Dec. 10-13, 2000. pp. 701-704 ISBN: 0-7803-6439-2.

Endo et al., "4-micro pixel CMOS image sensor with low image lag and high-temperature operability," *Sensors and Camera Systems for Scientific, Industrial, and Digital Photography Applications*, Proceedings of SPIE-IS&T Elec. Imaging, SPIE vol. 5017 (2003). pp. 196-204.

E.G. Stevens and J.P. Lavine in *IEEE Trans. on Electron Devices*, vol. 41, No. 10, p. 1753-1760, Oct. 1994.

G. Meynants, et al., "CMOS Active Pixel Image Sensor with CCD Performance," SPIE EUROPTO AFPAEC Conference, May 18-19, 1998.

H. Takahashi, et al., "A 3.9um Pixel Pitch VGA Format 10-b Digital Output CMOS Image Sensor With 1.5 Transistor/Pixel," IEEE Journal of Solid-State Circuits, vol. 39, No. 12, Dec. 2004, pp. 2417-2425.

George Lungu et al., "Design, Fabrication and Characterization of a Family of Active Pixel CID Images," Proceedings SPIE 1999, vol. No. 3649, pp. 67-73.

Endo et al., "4-micro pixel CMOS image sensor with low image lag and high-temperature operability," *Sensors and Camera Systems for Scientific, Industrial, and Digital Photography Applications*, Proceedings of SPIE-IS&T Elec. Imaging, SPIE vol. 5017 (2003). pp. 196-204.

E.G. Stevens and J.P. Lavine in *IEEE Trans. on Electron Devices*, vol. 41, No. 10, pp. 1753-1760, Oct. 1994.

G. Meynants, et al., "CMOS Active Pixel Image Sensor with CCD Performance," SPIE EUROPTO AFPAEC Conference, May 18-19, 1998.

H. Takahashi, et al., "A 3.9um Pixel Pitch VGA Format 10-b Digital Output CMOS Image Sensor With 1.5 Transistor/Pixel," IEEE Journal of Solid-State Circuits, vol. 39, No. 12, Dec. 2004, pp. 2417-2425.

Furumiya et al., "High Sensitivity and No-Cross-Talk Pixel Technology for Embedded CMOS Image Sensor", International Electron Devices Meeting 2000. IEDM Technical Digest, San Francisco, CA, Dec. 10-13, 2000. pp. 701-704 ISBN: 0-7803-6439-2.

George Lungu et al., "Design, Fabrication and Characterization of a Family of Active Pixel CID Images," Proceedings SPIE 1999, vol. No. 3649, pp. 67-73.

S. Inoue et al., "A 3.25 M-pixel APS-C size CMOS Image Sensor", ITE Technical Report, vol. 25, No. 28, pp. 37-41, Mar. 2001.

\* cited by examiner

PHOTODETECTOR AND N-LAYER STRUCTURE FOR IMPROVED COLLECTION EFFICIENCY

CROSS-REFERENCE TO RELATED APPLICATIONS

Reference is made to and priority claimed from U.S. Provisional Application Ser. No. 60/721,168, filed Sep. 28, 2005, entitled PHOTODETECTOR AND N-LAYER STRUCTURE FOR IMPROVED COLLECTION EFFICIENCY.

FIELD OF THE INVENTION

The invention relates generally to the field of image sensors, and more particularly, to such image sensors having a lightly doped layer of the same conductivity type as the collection region of photodetectors for reducing cross talk.

BACKGROUND OF THE INVENTION

Figure 1A:
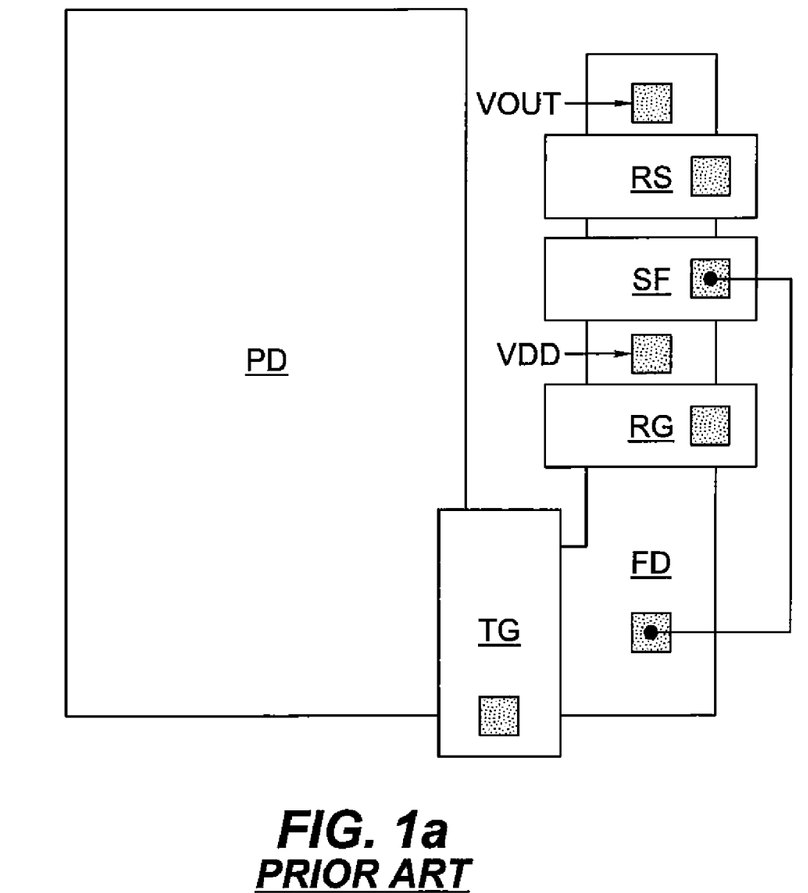
FIG. 1a is a top view of a prior art image sensor.

As is well known in the art, active CMOS image sensors typically consist of an array of pixels. Typically, each pixel consists of a photodetector element and one or more transistors to read out a voltage representing the light sensed in the photodetector. FIG. 1a shows a typical pixel layout for an active pixel image sensor. The pixel consists of a photodiode photodetector (PD), a transfer gate (TG) for reading out the photogenerated charge onto a floating diffusion (FD), which converts the charge to a voltage. A reset gate (RG) is used to reset the floating diffusion to voltage VDD prior to signal readout from the photodiode. The gate (SF) of a source follower transistor is connected to the floating diffusion for buffering the signal voltage from the floating diffusion. This buffered voltage is connected to a column buss (not shown) at $V_{OUT}$ through a row select transistor gate (RS), used to select the row of pixels to be read out.

As the demand for higher and higher resolution within a given optical format pushes pixel sizes smaller and smaller, it becomes increasingly more difficult to maintain other key performance aspects of the device. In particular, quantum efficiency and cross talk of the pixel start to severely degrade as pixel size is reduced. (Quantum efficiency drops and cross talk between pixels increases.) Cross talk is defined as the ratio of the signal in the non-illuminated to the illuminated pixel(s), and can be expressed as either a fraction or percentage. Therefore, cross talk represents the relative amount of signal that does not get collected by the pixel(s) under which it was generated. Recently, methods have been described to improve quantum efficiency, but at the expense of increased cross talk. (See FIG. 4 in U.S. Pat. No. 6,225,670 B1) Alternatively, vertical-overflow drain (VOD) structures used for blooming protection have been employed which reduce cross talk (S. Inoue et al., "A 3.25 M-pixel APS-C size CMOS Image Sensor," in Eisoseiho Media Gakkai Gijutsu Hokoku (Technology Report, Image Information Media Association) Eiseigakugiko, vol. 25, no. 28, pp. 37-41, March 2001. ISSN 1342-6893.) at the expense of quantum efficiency.

Increasing the depletion depth of the photodetector will increase the collection efficiency of the device, thereby improving both quantum efficiency and cross talk properties. In the past, this has been achieved by reducing the doping concentration of the bulk material in which the detector is made. However, this approach is known to result in reduced charge capacity and increased dark-current generation (from the increase in the bulk diffusion component) thereby reducing the dynamic range and exposure latitude of the detector.

U.S. Pat. No. 6,297,070 avoids these particular difficulties and describes a photodetector structure wherein the photodiode doping is deeper than other source and drain n-type dopants used in making CMOS image sensors. The increased depletion depth increases the collection efficiency, thereby increasing quantum efficiency while reducing cross talk. When building this structure using high-energy implantation, however, the n-diode to p-epi junction depth (and hence, depletion depth) is limited by the thickness of the masking layer (typically photoresist) that is used to block the implant from other regions of the device. Hence, the maximum resist thickness and aspect ratio (resist height by resist opening) that can be used at this step becomes a limiting factor.

Figure 1B:
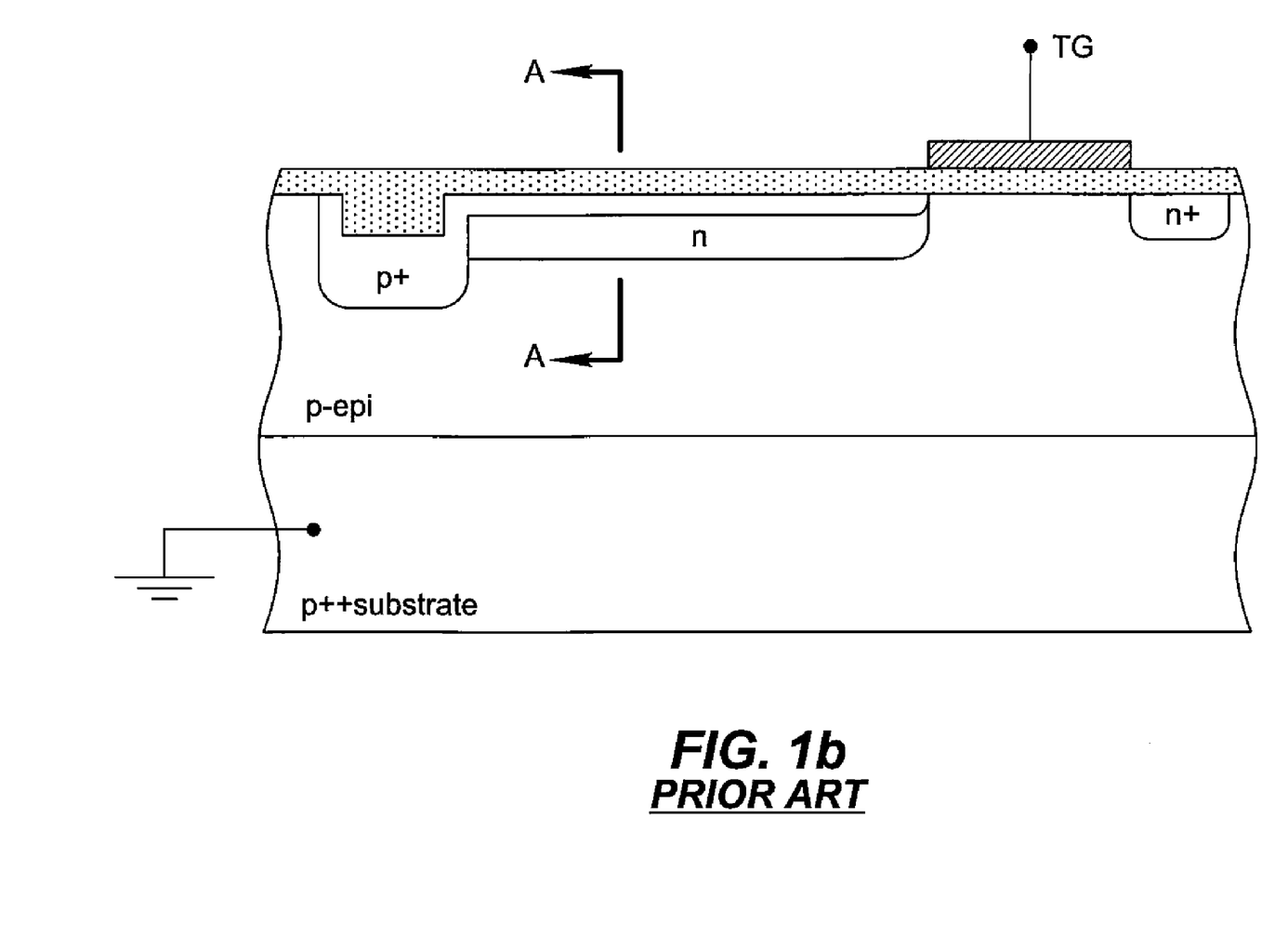
FIG. 1b is a two dimensional doping of a prior art image sensor.
Figure 1C:
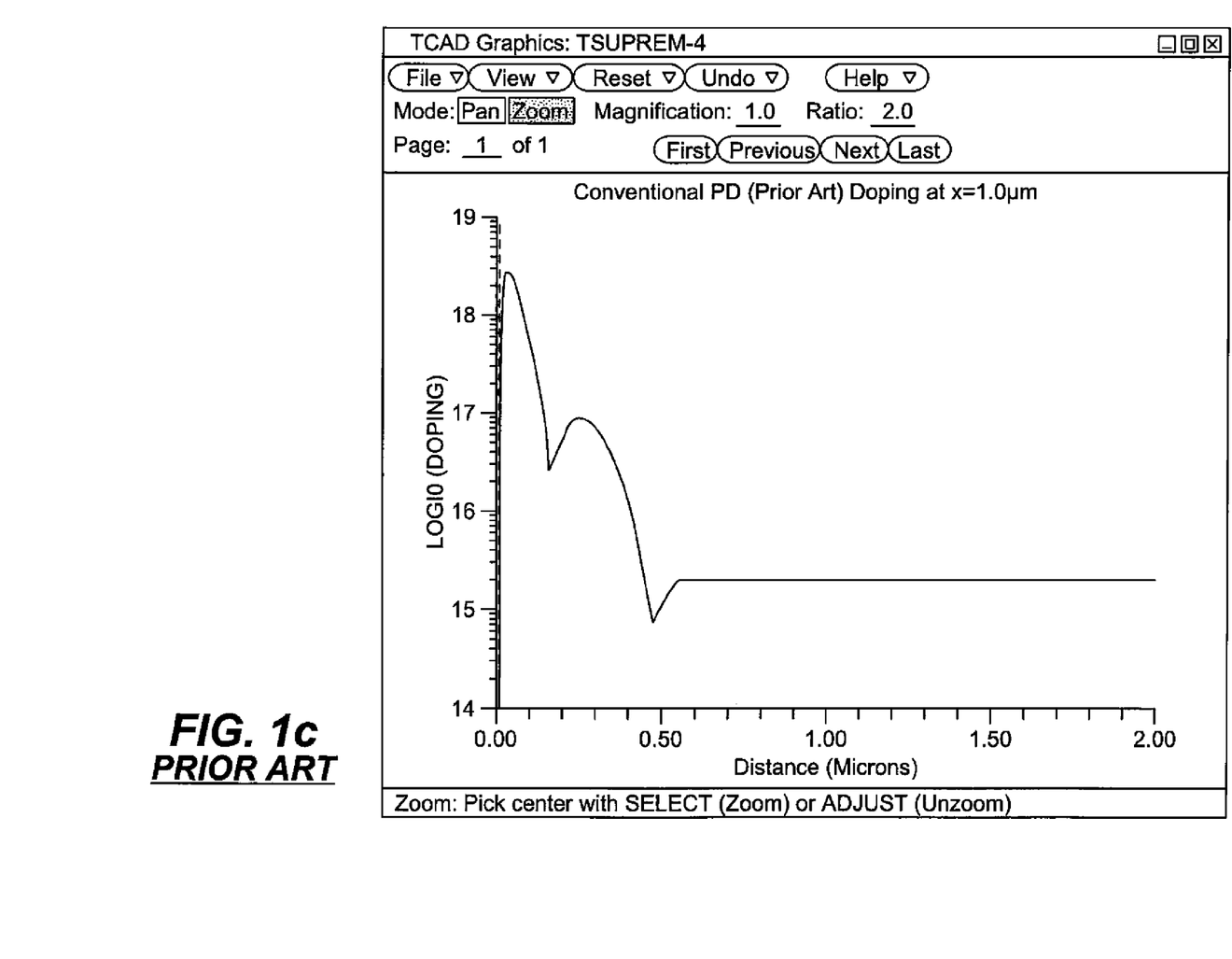
FIG. 1c is a doping profile of a prior art image sensor.
Figure 1D:
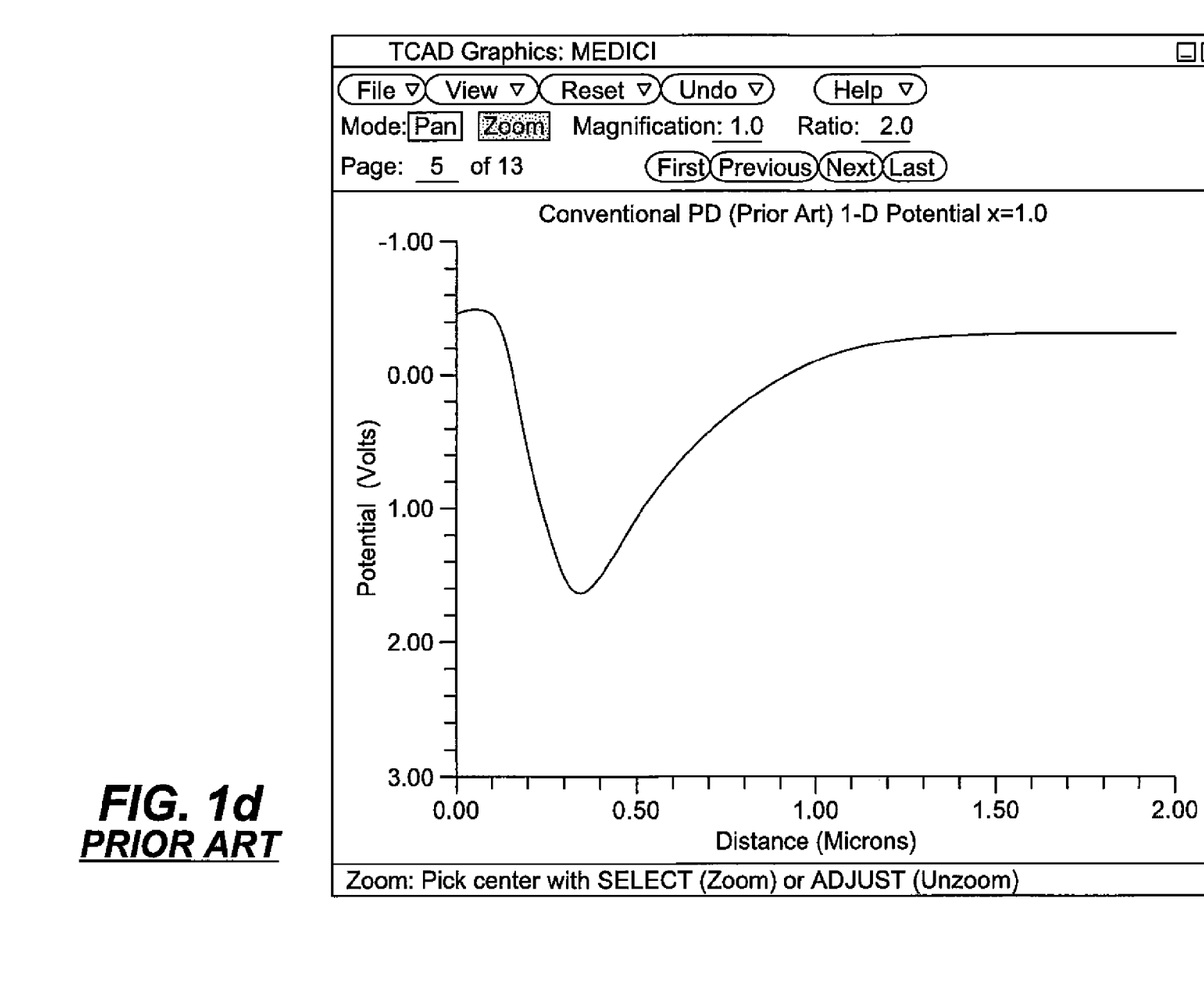
FIG. 1d is a potential profile of a prior art image sensor.

Still further, in the prior art, the n-type region of a pinned photodiode was formed using a single, relatively shallow implant as illustrated by way of example in FIGS. 1b and 1c. The resulting potential profile for such a prior art empty photodiode is shown in FIG. 1d. From this figure, it can be seen that the depletion depth (the point at where the gradient of the electric potential goes to zero) for this example prior-art pixel structure is only about 1.2 um. At green and red wavelengths, the absorption depth in silicon is greater than this depletion depth. Therefore, a carrier generated greater than this depletion depth can diffuse laterally into adjacent photosites which contributes to cross talk.

Therefore, there exists a need within the art to provide a structure that improves both quantum efficiency and cross-talk attributes simultaneously, without impacting other imaging performance characteristics and without the manufacturing issues as described above.

SUMMARY OF THE INVENTION

The present invention is directed to overcoming one or more of the problems set forth above. Briefly summarized, according to one aspect of the present invention, the invention resides in an image sensor with an image area having a plurality of photodetectors of a first conductivity type comprising a substrate of the second conductivity type; a first layer of the first conductivity type spanning the image area; a second layer of the second conductivity type; wherein the first layer is between the substrate and the second layer, and the plurality of photodetectors is disposed in the second layer and abut the first layer.

ADVANTAGEOUS EFFECT OF THE INVENTION

The present invention has the following advantage of providing a structure that improves both quantum efficiency and cross-talk attributes simultaneously, without impacting other imaging performance characteristics.

DETAILED DESCRIPTION OF THE INVENTION

Figure 2:
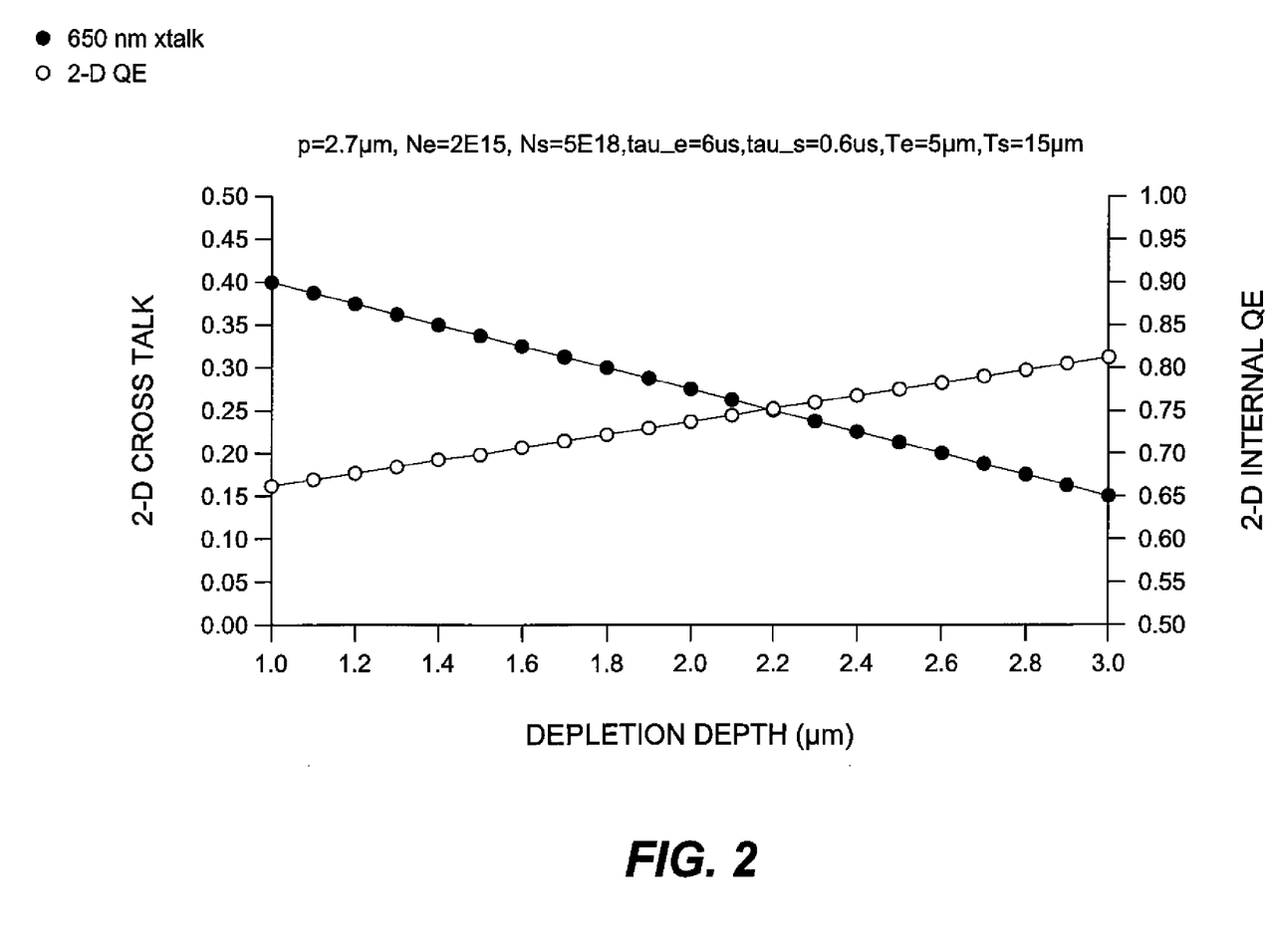
FIG. 2 is a chart of cross talk versus depletion depth.

Before discussing the present invention in detail, it is beneficial to understand cross talk in image sensors. In this regard, cross talk is defined as the ratio of the signal in the non-illuminated to the illuminated pixel(s), and can be expressed as either a fraction or percentage. Therefore, cross talk represents the relative amount of signal that does not get collected by the pixel(s) under which it was generated. The dependence of cross talk and internal quantum efficiency (no reflection or absorption losses from any layers covering the photodetector) on depletion depth for an example pixel is illustrated in FIG. 2. The cross-talk calculation assumes that every other pixel along a line is illuminated (and the alternating, interleaved pixels are not.) A wavelength of 650 nm was assumed, since cross talk is more of a problem at longer wavelengths. It can be seen from this figure that increasing the depletion depth can significantly reduce cross talk while increasing quantum efficiency. Still further, the depletion depth as used herein is defined as the point furthest away from the surface at which the gradient of the electric potential goes to zero.

Therefore, from FIG. 2 it can be seen that the cross talk would be ~36% and the internal quantum efficiency would be ~68% for the prior art structure. It can also be seen from FIG. 2 that cross talk can be significantly reduced by increasing the depletion depth.

Figure 3:
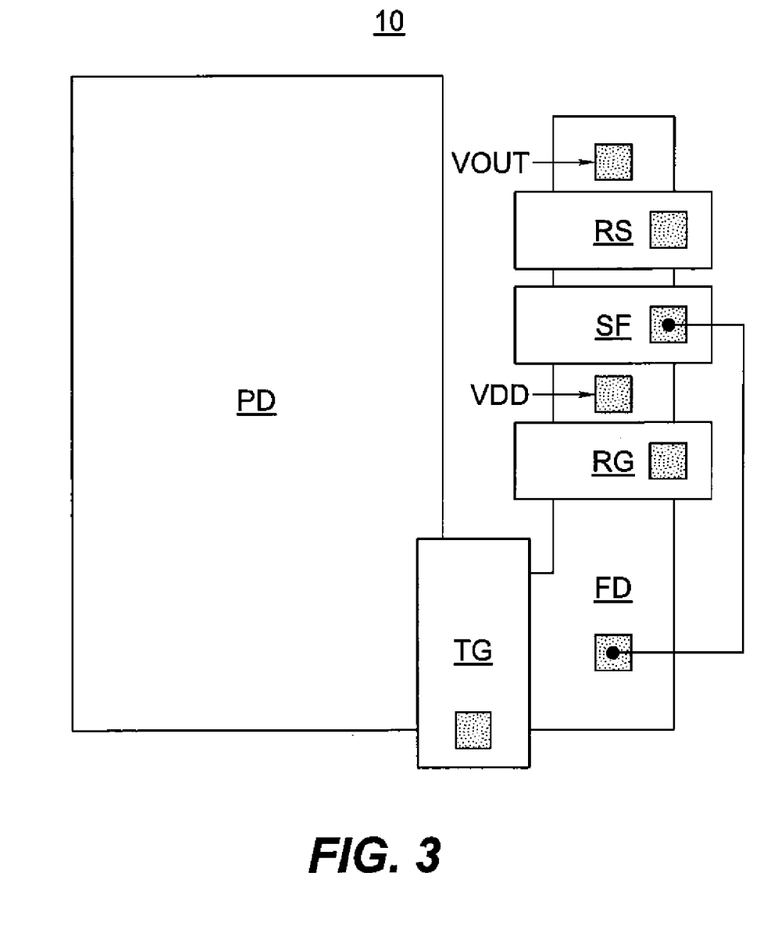
FIG. 3 is a top view if the image sensor of the present invention.

The present invention describes a photodetector structure for an active CMOS image sensor with an extended depletion depth to increase quantum efficiency and reduce pixel-to-pixel cross talk while maintaining good charge capacity and dynamic range characteristics. The top view of a CMOS image sensor pixel of the present invention incorporating this photodetector structure is shown in FIG. 3, which form a top view and looks similar to FIG. 1. This is because the present invention of FIG. 3 includes additional layers not shown in FIG. 1 because the additional layers are beneath the top surface and thus not visible from a top view (most notably first and second layers). Although the preferred embodiment shown includes a pinned photodiode consisting of a p+ pinning (top surface) layer and an n-type buried collecting region within a p−/p++ epi substrate, it will be understood that those skilled in the art that other structures and doping types can be used without departing from the scope of the invention. For example, a simple unpinned n-type diode formed in a p-type substrate, or a p-type diode formed in an n-type substrate could be used, if desired. It is also noted that only a portion of the image sensor of the present invention is shown for clarity. For example, although only one photodetector is shown, there are a plurality of photodetectors arranged in either a one or two-dimensional array.

Referring to FIG. 3 there is shown a pixel 10 of the present invention having a photodiode photodetector (PD), a transfer gate (TG) for reading out the photogenerated charge onto a floating diffusion (FD), which converts the charge to a voltage. A reset gate (RG) is used to reset the floating diffusion to voltage VDD prior to signal readout from the photodiode. The gate (SF) of a source follower transistor is connected to the floating diffusion for buffering the signal voltage from the floating diffusion. This buffered voltage is connected to a column buss (not shown) at $V_{OUT}$ through a row select transistor gate (RS), used to select the row of pixels to be read out. From the plan view (FIG. 3), regions outside the photodetector but within the pixel are defined as the pixel circuitry region.

Figure 4A:
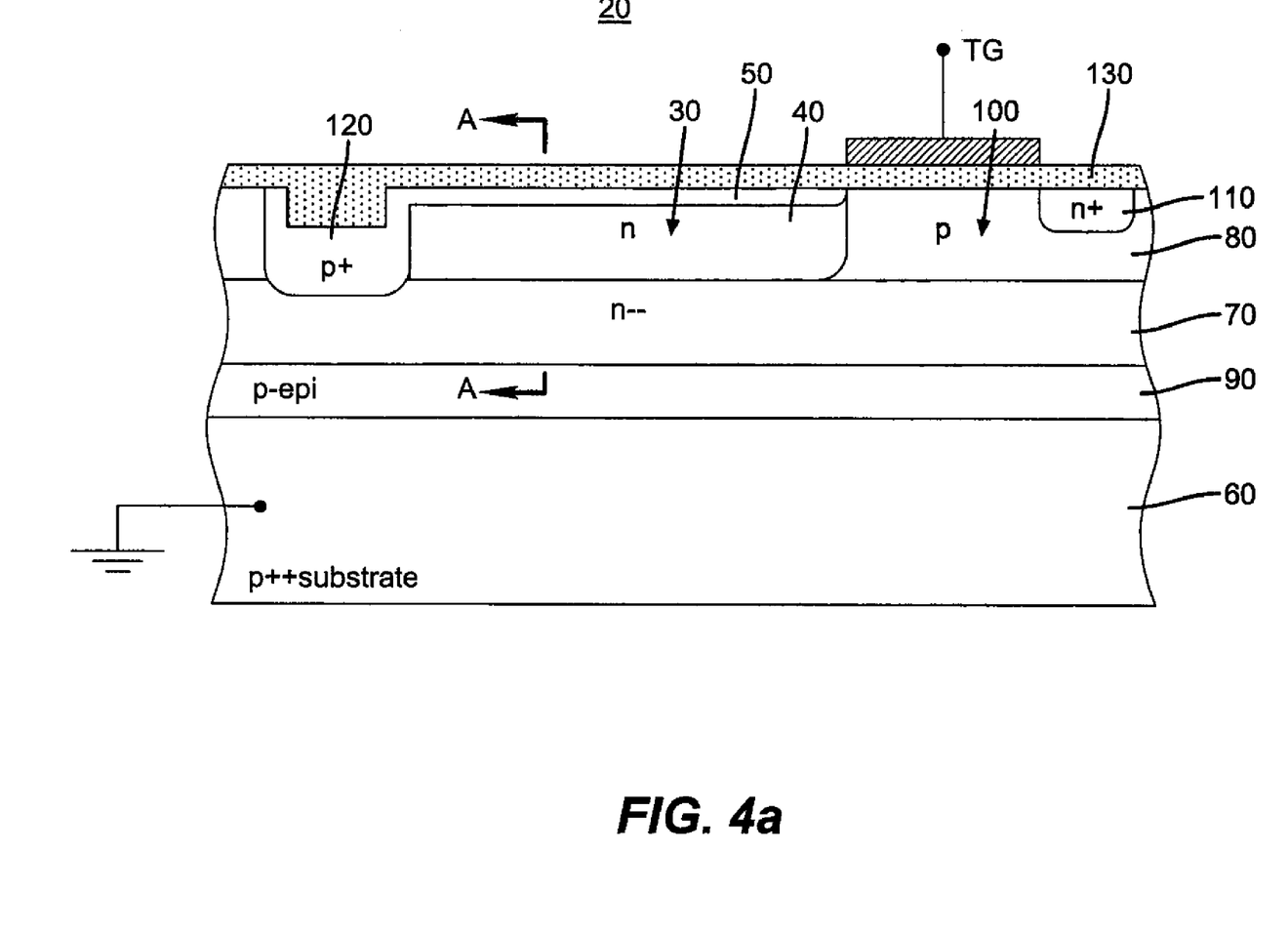
FIG. 4a is a cross section of the image sensor of the present invention.

Referring to FIG. 4a, there is shown a side view in cross section of an image sensor 20 of the present invention. The image sensor 20 includes an imaging portion having a plurality of photodetectors 30 (only one of which is shown), preferably pinned photodiodes 30 of two conductivity types, preferably n-type collection region 40 and p-type pinning layer 50. A substrate 60 of a conductivity type, preferably p-type for the preferred embodiment, forms a base portion for the image sensor 20. A first layer 70 of a conductivity type, preferably n-type, spans the image area. It is noted that the first layer 70 physically contacts the n-type collection region 40 of the photodiode 30 thereby extending the depletion region and photo collection region of the photodiode 30. A second layer 80 of a conductivity type, preferably p-type, is disposed vertically adjacent the first layer 70 for preferably forming entire or parts of electrical components, such as for portions of transistors. Optionally, a third layer 90, preferably a p-epitaxial layer, may be positioned between the first layer 70 and the substrate 60.

It is particularly pointed out that the first layer 70 is positioned between the substrate 60 and the second layer 80, and the plurality of photodetectors 30 are disposed in the second layer 80 and abut the first layer 70. The first layer 70 is particularly suited for substantially reducing cross talk of electrons that stray from the photodetectors 30 into this layer. The first layer 70 will direct all or substantially all of the stray electrons back into the nearest photodetector 30, which is the most likely candidate from which it originally strayed.

For thoroughness, it is noted that the image sensor 20 includes a transfer gate (TG) having a channel 100 of a conductivity type, preferably p-type. This channel 100 is formed from the second layer 80 as discussed hereinabove and charge passes from the photodetector 30 through the channel 100 to a floating diffusion 110 of a conductivity type (preferably n-type), which converts the charge to a voltage. A channel stop 120 of a conductivity type, preferably p-type, is laterally adjacent the photodetector 30. A top layer 130 forms a dielectric as is well know in the art.

Figure 4B:
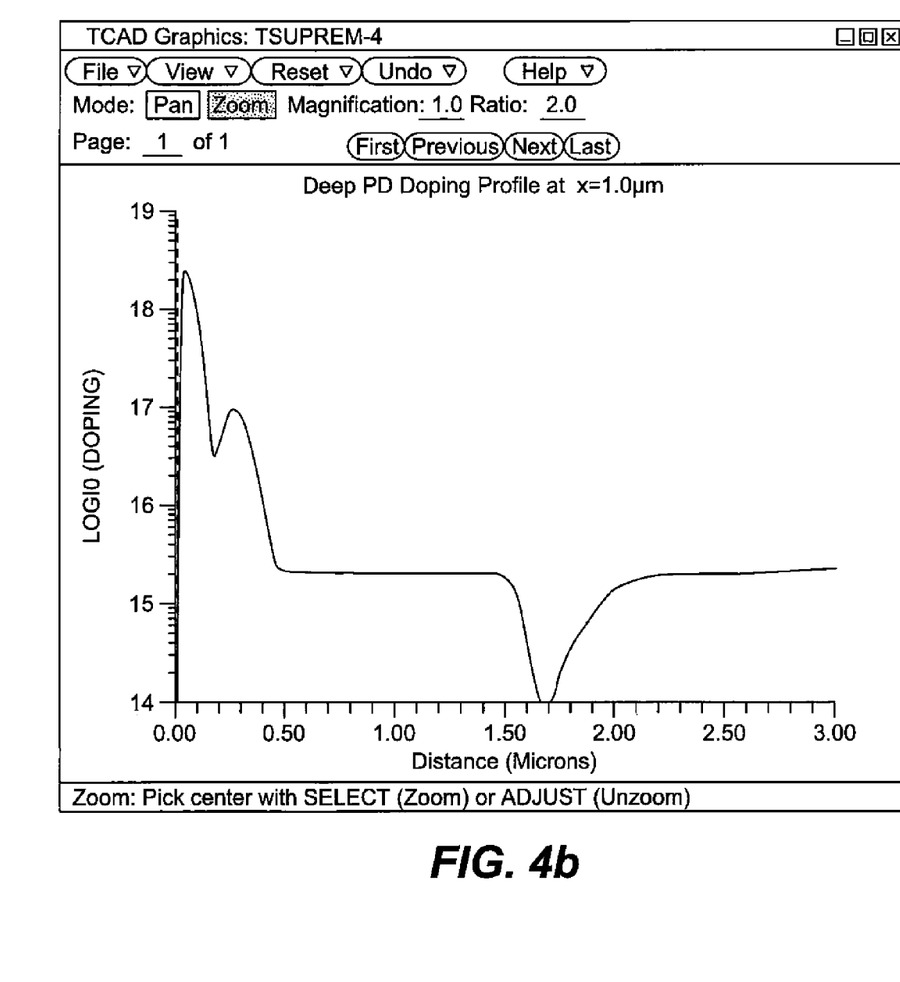
FIG. 4b is a doping profile down the center of the photodetector of the present invention.

Therefore, the present invention extends the depletion depth, thereby reducing cross talk without reducing QE. The present invention adds a deep and relatively low concentration layer (first layer 70), which contacts the back of the main, higher concentration surface portion of the doping profile within the photodetector 30 as illustrated by the example structure as shown in FIG. 4a and 4b. In other words, the first layer 70 beneath the photodetector 30 is depleted of free carriers due to its relatively low dopant concentration. This deep, laterally uniform, low-concentration layer (first layer 70) can be formed via a series, or chain of relatively low-dose, multiple high-energy implants and/or thermal drive. An alternative embodiment of the invention would be to form the first layer 70 and second layer 80 and optional third layer 90 on top of the substrate 60 via epitaxial growth. Since this deep first layer 70 is formed under the entire pixel and image areas, the transfer gate (TG), floating diffusion 110, source follower (SF) and any and all other support circuitry within the individual pixels are formed in the second layer 80. Although certainly it could, the first layer 70 does not need to extend out into the periphery of the device outside of the image area where row and column address circuitry, A/D converters, analog buffers, etc. are typically located. The deep, uniform first layer 70 only needs to be formed within the image area that contains all of the imaging (and dark reference, etc.) pixels.

Figure 5:
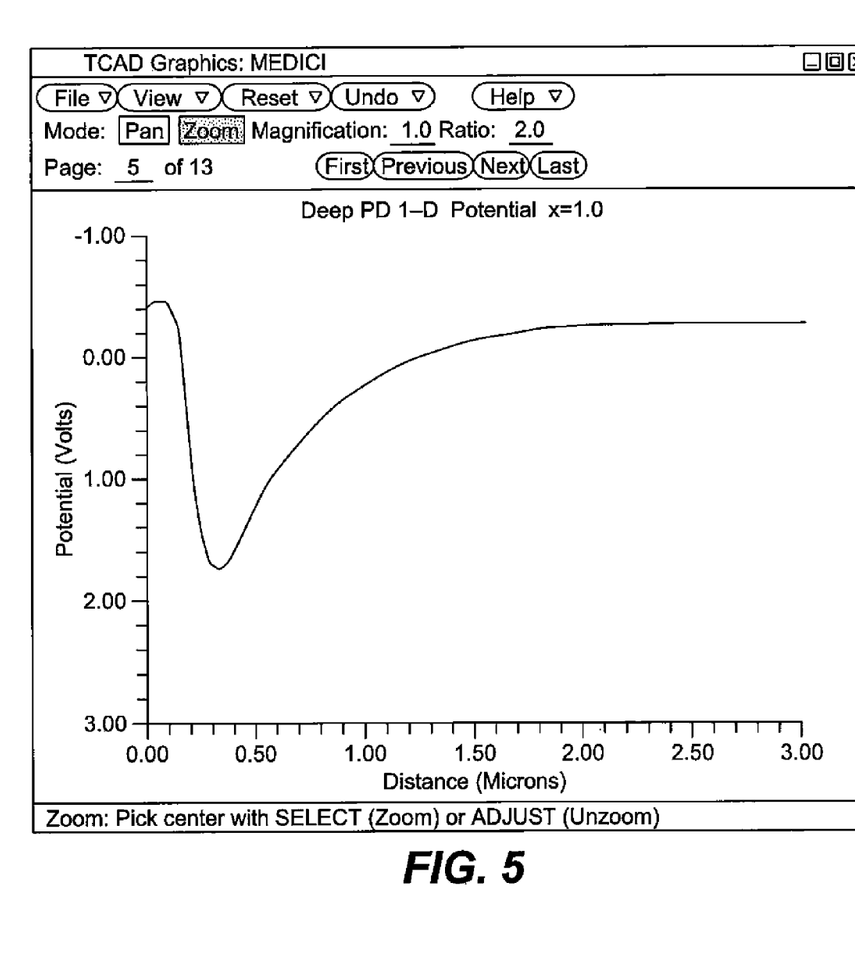
FIG. 5 is a potential profile of the photodetector of the present invention.

FIG. 5 shows the resulting potential profile down into the base of the detector, from which it can be seen that the depletion depth of this example of the new structure is around 2.3 um. This depletion depth could be extended even further by increasing the depth of the metallurgical junction, which is a function of implant energy and/or thermal drive time of the first embodiment, or by simply varying the thickness of the various epitaxial layers for the alternate embodiment.

An additional benefit of the present invention is that the first layer 70 can be depleted of free carriers in areas outside of the pinned photodiode area (i.e., pixel circuitry) between the second layer 80 and third layer 90. Depleting the area under the pixel circuitry region reduces the lateral diffusion of carriers and results in lower cross talk.

Figure 6:
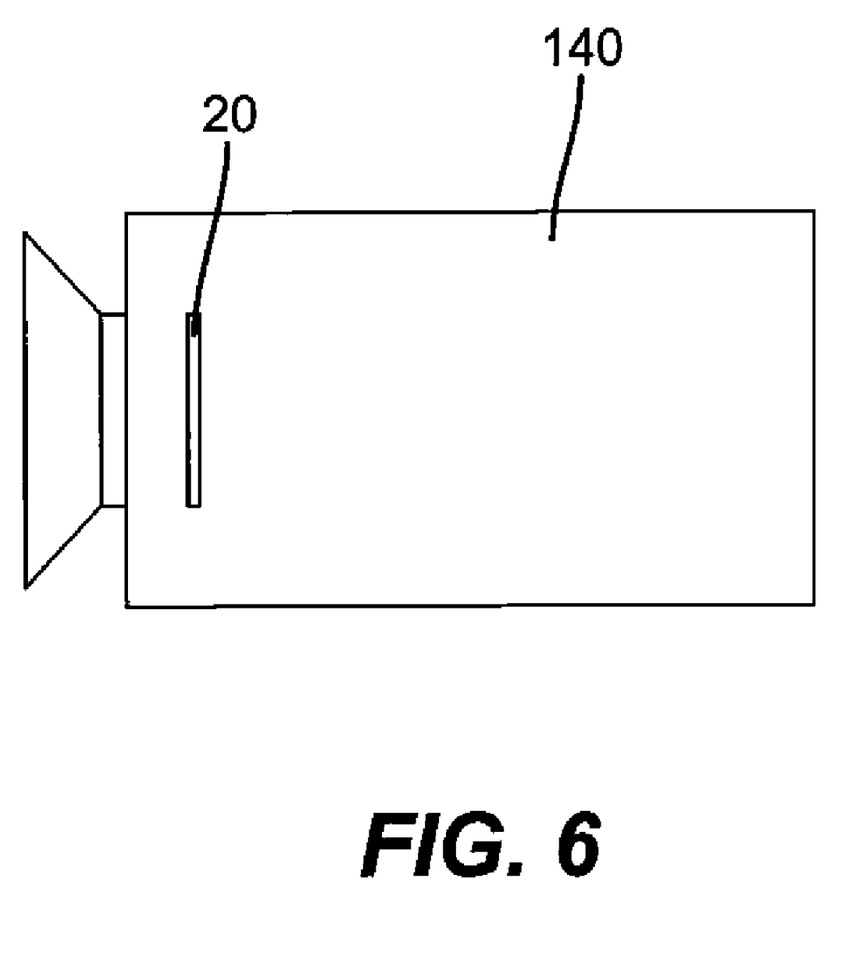
FIG. 6 is an illustration of a digital camera for illustrating a typical commercial embodiment of the present invention to which the ordinary consumer is accustomed.

Referring to FIG. 6, a digital camera 140 having the image sensor 20 of the present invention disposed therein is shown for illustrating a typical commercial embodiment for the present invention.

The invention has been described with reference to a preferred embodiment. However, it will be appreciated that variations and modifications can be effected by a person of ordinary skill in the art without departing from the scope of the invention.

PARTS LIST 10 pixel
20 image sensor
30 photodetector/photodiodes
40 n-type collection region
50 p-type pinning layer
60 substrate
70 first layer
80 second layer
90 third layer
100 channel
110 floating diffusion
120 channel stop
130 top layer
140 digital camera

The invention claimed is:

1. An image sensor with an image area having a plurality of photodetectors each having a collection region of a first conductivity type comprising:
   (a) a substrate of a second conductivity type;
   (b) a laterally uniform first layer of the first conductivity type spanning the image area; and
   (c) a second layer of the second conductivity type;
   wherein the first layer is between the substrate and the second layer, and the plurality of collection regions is disposed in the second layer and abut the first layer.

2. The image sensor as in claim 1, wherein each photodetector further comprises a pinning layer of the second conductivity type.

3. The image sensor as in claim 1, wherein the first conductivity type is n-type and the second conductivity type is p-type.

4. The image sensor as in claim 1 further comprising an epitaxial layer of the second conductivity type between the substrate and the first layer.

5. The image sensor as in claim 1, wherein the first layer is depleted of free carriers beneath the photodetector.

6. The image sensor as in claim 5, wherein the first layer is depleted of free carriers beneath the photodetector and pixel circuitry region.

7. A digital camera comprising:
   an image sensor with an image area having a plurality of photodetectors each having a collection region of a first conductivity type comprising:
   (a) a substrate of a second conductivity type;
   (b) a laterally uniform first layer of the first conductivity type spanning the image area; and
   (c) a second layer of the second conductivity type;
   wherein the first layer is between the substrate and the second layer, and the plurality of collection regions is disposed in the second layer and abut the first layer.

8. The digital camera as in claim 7, wherein each photodetector further comprises a pinning layer of the second conductivity type.

9. The digital camera as in claim 7, wherein the first conductivity type is n-type and the second conductivity type is p-type.

10. The digital camera as in claim 7 further comprising an epitaxial layer of second conductivity type between the substrate and the first layer.

11. The digital camera as in claim 7, wherein the first layer is depleted of free carriers.

12. The digital camera as in claim 11, wherein the first layer is fully depleted of free carriers.

* * * * *